United States Patent
Oe et al.

(10) Patent No.: US 8,553,738 B2
(45) Date of Patent: Oct. 8, 2013

(54) LASER LIGHT SOURCE DEVICE

(75) Inventors: Shinichi Oe, Tokyo (JP); Motoaki Tamaya, Tokyo (JP); Akira Nakamura, Tokyo (JP); Keiichi Fukuda, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 0 days.

(21) Appl. No.: 12/741,149

(22) PCT Filed: Dec. 28, 2007

(86) PCT No.: PCT/JP2007/075320
§ 371 (c)(1),
(2), (4) Date: May 3, 2010

(87) PCT Pub. No.: WO2009/084112
PCT Pub. Date: Jul. 9, 2009

(65) Prior Publication Data
US 2010/0260218 A1 Oct. 14, 2010

(51) Int. Cl.
*H01S 3/04* (2006.01)
(52) U.S. Cl.
USPC .................................. 372/36; 372/21; 372/34
(58) Field of Classification Search
USPC .................................. 372/36, 21, 34
See application file for complete search history.

(56) References Cited

U.S. PATENT DOCUMENTS

| | | | |
|---|---|---|---|
| 4,546,478 A * | 10/1985 | Shimizu et al. | 372/36 |
| 4,592,059 A * | 5/1986 | Westermeier | 372/36 |
| 5,068,865 A | 11/1991 | Ohshima et al. | |
| 5,283,446 A | 2/1994 | Tanisawa | |
| 5,644,586 A * | 7/1997 | Kawano et al. | 372/44.01 |
| 6,130,902 A | 10/2000 | Shimoji | |
| 6,961,357 B2 * | 11/2005 | Moriya et al. | 372/34 |
| 2001/0048698 A1 * | 12/2001 | Lorenzen et al. | 372/36 |
| 2001/0048705 A1 | 12/2001 | Kitaoka et al. | |
| 2005/0094687 A1 | 5/2005 | Naganuma | |
| 2006/0186500 A1 * | 8/2006 | Stephens | 257/433 |

FOREIGN PATENT DOCUMENTS

| | | |
|---|---|---|
| CN | 1692535 A | 11/2005 |
| JP | 02-001804 A | 1/1990 |
| JP | 03-217065 A | 9/1991 |
| JP | 04-352377 A | 7/1992 |

(Continued)

OTHER PUBLICATIONS

International Search Report for PCT/JP2007/075320, mailed Feb. 5, 2008.
Written Opinion of the International Searching Authority for PCT/JP2007/075320, mailed Feb. 5, 2008 (in Japanese).
Chinese Office Action issued on Apr. 20, 2011 in corresponding Chinese application.

(Continued)

*Primary Examiner* — Yuanda Zhang
(74) *Attorney, Agent, or Firm* — Buchanan Ingersoll & Rooney PC

(57) ABSTRACT

In a laser light source device having an optical element and a plurality of heat sinks on which the optical element is joined directly or through a sub mount, and obtained by joining the heat sinks to each other by means of a joining material such that optical elements are optically directly joined to each other, the laser light source device includes a groove portion extending in a direction substantially orthogonal to an optical axis of light in the laser light source device on any one of a joining surface of the optical element or the sub mount to join with the heat sink and a joining surface of the heat sink to join with the optical element or the sub mount.

8 Claims, 2 Drawing Sheets

(56) References Cited

FOREIGN PATENT DOCUMENTS

| | | |
|---|---|---|
| JP | 05-060952 A | 3/1993 |
| JP | 05-25756 U | 4/1993 |
| JP | 07-209559 A | 8/1995 |
| JP | 11-289131 A | 10/1999 |
| JP | 2000-183439 A | 6/2000 |
| JP | 2001-242499 A | 7/2001 |
| JP | 2001-298237 A | 10/2001 |
| JP | 2002-289956 A | 10/2002 |
| JP | 2003-043312 A | 2/2003 |
| JP | 2005-223083 A | 8/2005 |
| WO | WO 2006/103767 A1 | 10/2006 |
| WO | WO 2007/013608 A1 | 2/2007 |

OTHER PUBLICATIONS

Extended European Search Report issued by the European Patent Office on Jun. 5, 2012 in corresponding European Application No. 07860523.5.

Office Action dated Mar. 4, 2013 issued by the Canadian Patent Office in corresponding Canadian Patent Application No. 2,710,955.

Office Action dated Mar. 11, 2013 issued by the European Patent Office in corresponding European Patent Application No. 07 860 523.5.

* cited by examiner

LASER LIGHT SOURCE DEVICE

TECHNICAL FIELD

The present invention relates to a laser light source device.

BACKGROUND ART

Conventionally, in a semiconductor laser device, a joining material is used when bonding a semiconductor chip and the like and a sub mount. When bonding the semiconductor chip, for controlling protrusion of the joining material in a predetermined direction, the sub mount in which a hollow portion is provided such that an area of a bonding surface of the semiconductor chip is made smaller than that of the semiconductor chip and the sub mount has a slope is used. According to this, the joining material protruding when joining the semiconductor chip flows along the slope to be accumulated in the hollow portion, so that the joining material is prevented from protruding on an optical surface of the semiconductor chip and from creeping up (for example, refer to the patent document 1).
Patent Document 1: Japanese Patent Laid-Open Application No. 2000-183439

DISCLOSURE OF INVENTION

Problem to be Solved by the Invention

However, in order to optically directly couple a plurality of optical elements with each other by means of butt joint as in a laser for light source, it is required to bring the optical elements closer to each other with a distance of several tens of micrometers. In this case, there is a problem that it is difficult in dimension and in shape to provide the slope and to add a concave shape such that the protruding joining material flows to be accumulated as in the above-described conventional sub mount. Further, since a minute amount of joining material protrudes on end faces of a heat sink, there is a problem that the optical elements are joined without a sufficient optical characteristic due to mechanical interference generated when bringing the optical elements closer to each other.

The present invention is achieved in view of the above description, and an object thereof is to obtain the laser light source device provided with a high-quality optical characteristic in which deterioration of the optical characteristic due to an excess joining material at the time of assembly is prevented.

Means for Solving Problem

In order to solve the above problem, and in order to attain the above object, in a laser light source device having an optical element and a plurality of heat sinks on which the optical element is joined directly or through a sub mount, and obtained by joining the heat sinks to each other by means of a joining material such that optical elements are optically directly joined to each other, the laser light source device of the present invention includes a groove portion extending in a direction substantially orthogonal to an optical axis of light in the laser light source device on any one of a joining surface of the optical element or the sub mount to join with the heat sink and a joining surface of the heat sink to join with the optical element or the sub mount.

Effect of the Invention

According to the present invention, by including the groove portion extending in the direction substantially orthogonal to the optical axis of the laser light in the laser light source device on any one of the joining surface of the optical element or the sub mount to join with the heat sink and the joining surface of the heat sink to join with the optical element or the sub mount, it is possible to prevent the joining material from protruding in the optical axis direction of the laser light on the joining surface of the heat sink. According to this, the mechanical interference generated due to the protruding joining material when bringing the optical elements closer to each other for optically directly coupling the optical elements with each other by means of the butt joint may be prevented. Therefore, according to the present invention, there is an effect that the laser light source device having the high-quality optical characteristic by preventing deterioration of the optical characteristic due to the protrusion of the excess joining material at the time of assembly may be realized.

Figure 1:
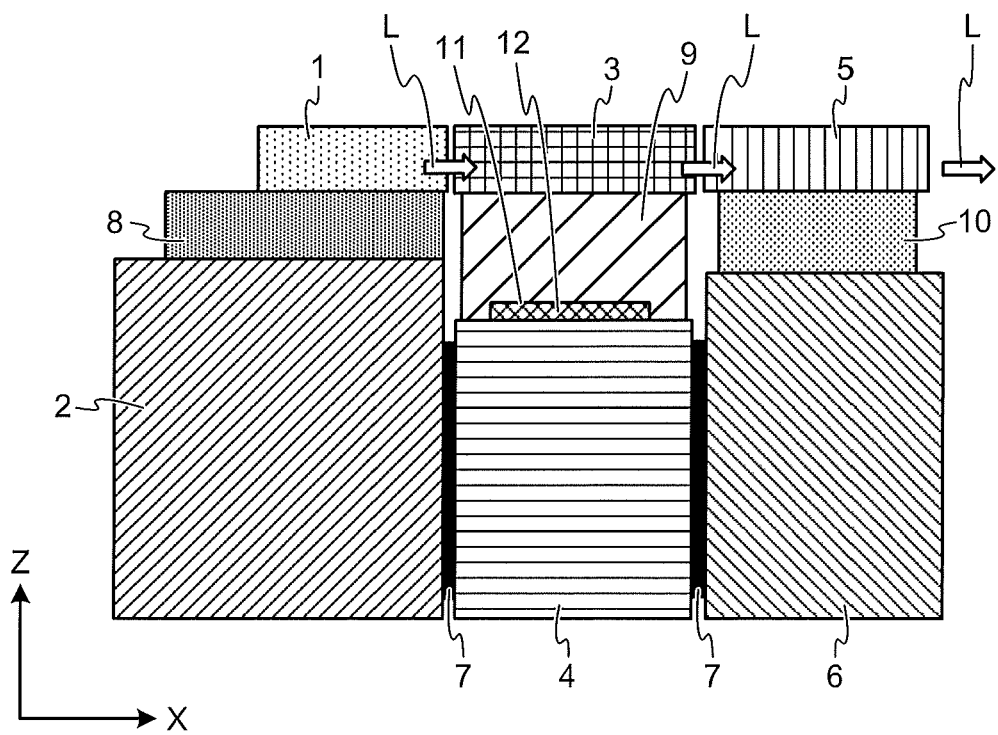
FIG. 1 is a cross-sectional view of a schematic configuration of an optical module being a laser light source device according to a first embodiment of the present invention.

EXPLANATIONS OF LETTERS OR NUMERALS 1 semiconductor laser chip
2 heat sink A
3 solid laser
4 heat sink B
5 wavelength conversion element
6 heat sink C
7 joining material
8 sub mount A
9 sub mount B
10 sub mount C
11 concave portion
12 joining material
13 conventional sub mount

BEST MODE(S) FOR CARRYING OUT THE INVENTION

Hereinafter, embodiments of a laser light source device according to the present invention is described in detail with reference to the drawings. Meanwhile, the present invention is not limited to a following description and may be appropriately changed without departing from the scope of the present invention.

First Embodiment

FIG. 1 is a cross-sectional view of a schematic configuration of an optical module being the laser light source device according to a first embodiment of the present invention. The optical module according to the first embodiment is an LD pumped solid laser light source having a laser diode (LD) as a pumping source.

The optical module according to the first embodiment is provided with a semiconductor laser chip 1, a solid laser 3 and a wavelength conversion element 5 as optical elements as shown in FIG. 1. The semiconductor laser chip 1 is fixedly bonded to a heat sink A2 by means of a joining material through a sub mount A8 as shown in FIG. 1 for diffusing heat in the semiconductor laser chip 1. The solid laser 3 is fixedly bonded to a heat sink B4 by means of the joining material through a sub mount B9 as shown in FIG. 1 for diffusing heat in the solid laser 3. The wavelength conversion element 5 is fixedly bonded to a heat sink C6 by means of the joining material through a sub mount C10 as shown in FIG. 1 for diffusing heat in the wavelength conversion element 5.

Here, each optical element is fixedly bonded to each heat sink through the sub mount such that an end face (side surface) of the heat sink and an end face (side surface) of the optical element mounted on the heat sink are substantially flush with each other. That is to say, it is configured such that an end face (side surface) on a solid laser 3 side of the semiconductor laser chip 1 is substantially flush with an end face (side surface) on a solid laser 3 side of the heat sink A2 on which the semiconductor laser chip 1 is mounted through the sub mount A8.

Also, it is configured such that an end face (side surface) on a semiconductor laser chip 1 side of the solid laser 3 is substantially flush with an end face (side surface) on a semiconductor laser chip 1 side of the heat sink B4 on which the solid laser 3 is mounted through the sub mount B9. It is configured such that an end face (side surface) on a wavelength conversion element 5 side of the solid laser 3 is substantially flush with an end face (side surface) on a wavelength conversion element 5 side of the heat sink B4 on which the solid laser 3 is mounted through the sub mount B9.

Also, it is configured such that an end face (side surface) on a solid laser 3 side of the wavelength conversion element 5 is substantially flush with an end face (side surface) on a solid laser 3 side of the heat sink C6 on which the wavelength conversion element 5 is mounted through the sub mount C10.

Also, the heat sink A2 is joined to the heat sink B4 by means of a joining material 7, and the heat sink B4 is joined to the heat sink C6 by means of the joining material. The optical elements (the semiconductor laser chip 1 and the solid laser 3, the solid laser 3 and the wavelength conversion element 5) are optically directly coupled with each other by means of butt joint, and it is configured such that the heat sinks are joined to each other in a state in which the end faces of the optical elements are brought closer to each other with a distance of several tens of micrometers for obtaining a sufficient optical characteristic.

In this optical module, laser light enters the solid laser 3 from the semiconductor laser chip 1, amplified laser light enters the wavelength conversion element 5 from the solid laser 3, and this is wavelength converted and is emitted from the wavelength conversion element 5. An optical axis of the laser light at that time is represented by L (X-direction) in FIG. 1.

A width (X-direction in FIG. 1) of a joining surface of the sub mount B9 with the heat sink B4 is made shorter than a width of the heat sink B4. Also, a slit-like concave portion 11 is provided on a rear surface of the sub mount B9 (the joining surface of the sub mount B9 with the heat sink B4) as a groove portion extending in a direction substantially horizontal to the joining surface and substantially orthogonal to the direction of the optical axis L of the laser light. Meanwhile, the groove portion in the present invention is the groove portion, which does not have openings on end faces (side surfaces) on a heat sink A2 side and a heat sink C6 side of the sub mount B9.

Figure 2:
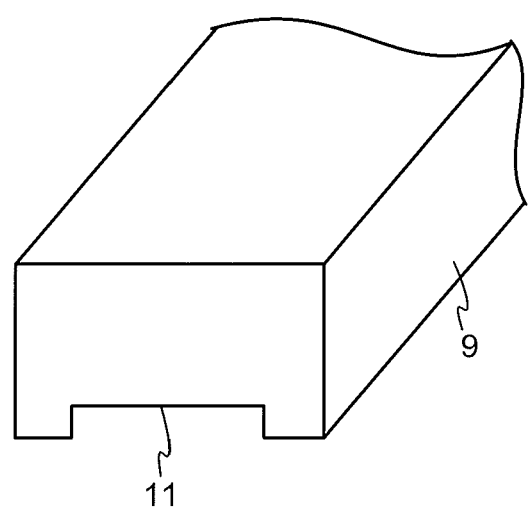
FIG. 2 is a perspective view of a sub mount alone composing the optical module according to the first embodiment of the present invention.

FIG. 2 is a perspective view of the sub mount B9 alone used in the optical module according to this embodiment. The slit-like concave portion 11 is provided in order to prevent an excess joining material from overflowing on a joining surface of the heat sink B4 and running down end faces (side surfaces) on a heat sink A2 side and a heat sink C6 side of the heat sink B4 when joining the sub mount B9 to the heat sink B4 by means of the joining material. That is to say, in the optical module according to this embodiment, the excess joining material out of the joining material for joining the sub mount B9 to the heat sink B4 is accumulated in the slit-like concave portion 11, so that the excess joining material is prevented from overflowing on the joining surface of the heat sink B4 and running down the end faces (side surfaces) on the heat sink A2 side and the heat sink C6 side of the heat sink B4.

Figure 3:
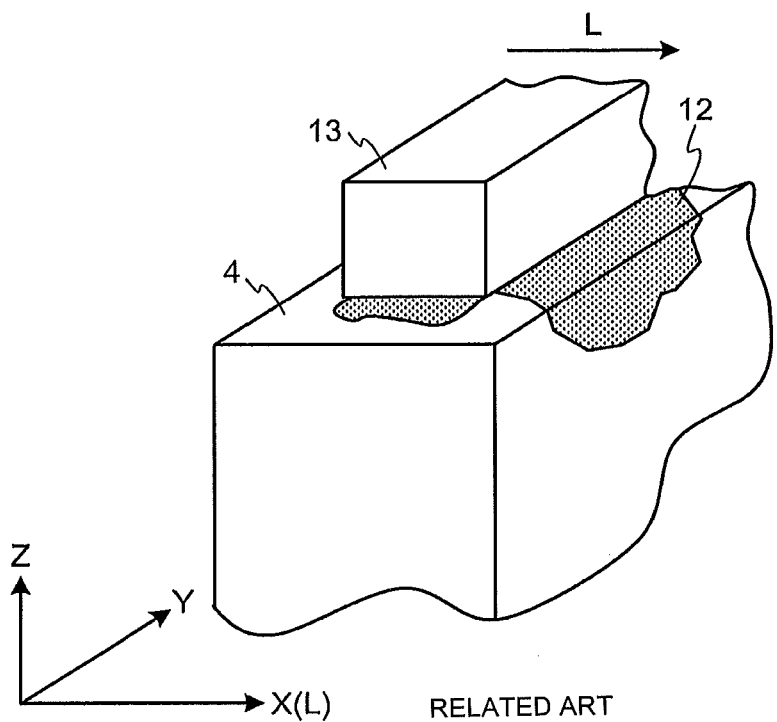
FIG. 3 is a perspective view for illustrating a state in which a sub mount on which a slit-like concave portion is not provided is joined to a heat sink by means of a joining material.

FIG. 3 is a perspective view for illustrating a state in which a conventional sub mount 13 on which the slit-like concave portion 11 is not provided is joined to the heat sink B4 by means of the joining material. In this case, since the slit-like concave portion 11 is not provided on the sub mount 13, an excess joining material 12 out of the joining material for joining the sub mount 13 to the heat sink B4 overflows on the joining surface of the heat sink B4 and runs down to the end faces (side surfaces) of the heat sink B4. When joining the heat sink B4 to the heat sink A2 and the heat sink C6 by bringing the optical elements closer to each other, mechanical interference with the heat sink A2 and the heat sink C6 is generated by the excess joining material 12 running down to the end faces (side surfaces) of the heat sink B4, so that it is not possible to join the optical elements with a desired optical characteristic.

Figure 4:
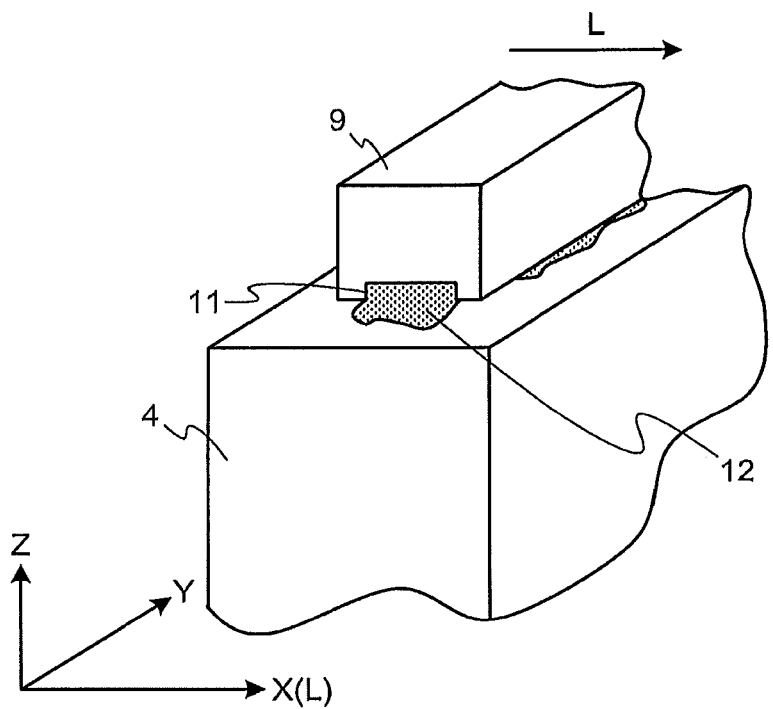
FIG. 4 is a perspective view for illustrating a state in which the sub mount according to the first embodiment of the present invention is joined to the heat sink by means of the joining material.

On the other hand, since the slit-like concave portion 11 is provided on the sub mount B9 in this embodiment, the excess joining material 12 out of the joining material flows in the direction substantially orthogonal to the optical axis L along the slit-like concave portion 11 in the sub mount B9 as shown in FIG. 4. FIG. 4 is a perspective view for illustrating a state in which the sub mount B9 is joined to the heat sink B4 by means of the joining material according to this embodiment.

By preventing the joining material 12 from protruding on the end faces (side surfaces) in the optical axis L direction of the sub mount B9 in this manner, the optical elements may be optically efficiently coupled with each other by means of the butt joint. Also, it becomes possible to make a width (X-direction) of the sub mount B9 the same as a width (X-direction) of the solid laser 3 without limit. According to this, heat generated by the solid laser 3 may be efficiently transferred to the heat sink B4 to be diffused.

A method of forming the slit-like concave portion 11 on the sub mount B9 includes mechanical fabrication and a method of forming a wall portion of the groove portion by means of plating and etching.

Although the slit-like concave portion 11 is formed on the sub mount B9 in this embodiment, the slit-like concave portion 11 is provided on at least one of adjacent sub mounts (the sub mounts A8 and B9, the sub mounts B9 and C10). Further, it is preferable that the slit-like concave portion 11 is provided on both of the adjacent sub mounts (the sub mounts A8 and B9, the sub mounts B9 and C10).

A method of fabricating the optical module according to this embodiment thus configured is described. First, the semiconductor laser chip 1 is fixedly bonded to the heat sink A2 by means of the joining material through the sub mount A8. Also, the solid laser 3 is fixedly bonded to the heat sink B4 by means of the joining material through the sub mount B9, and the wavelength conversion element 5 is fixedly bonded to the heat sink C6 by means of the joining material through the sub mount C10.

Next, the heat sink B4 to which the solid laser 3 is joined is joined to the heat sink A2 to which the semiconductor laser chip 1 is joined by means of the joining material 7. Thereafter, the heat sink C6 to which the wavelength conversion element 5 is joined is joined to the heat sink B4 by means of the joining material 7. At that time, the heat sinks are joined to each other in a state in which the end faces of the optical elements are brought closer to each other with the distance of several tens of micrometers in order that the optical elements (the semiconductor laser chip 1 and the solid laser 3, the solid laser 3 and the wavelength conversion element 5) are optically directly coupled with each other by means of the butt joint for sufficiently obtaining the optical characteristic.

As described above, in the optical module according to this embodiment, the slit-like concave portion 11 extending in the direction substantially horizontal to the joining surface and substantially orthogonal to the direction of the optical axis L of the laser light in the own device is provided on the joining surface of the sub mount B9 with the heat sink B4. Therefore, the excess joining material 12 out of the joining material for joining the sub mount B9 to the heat sink B4 flows in the direction substantially orthogonal to the optical axis L along the slit-like concave portion 11 in the sub mount B9. According to this, the excess joining material 12 does not protrude on the end faces (side surfaces) in the optical axis L direction of the sub mount B9, and the optical elements may be optically efficiently coupled with each other by means of the butt joint. Therefore, according to the optical module according to this embodiment, the laser light source device having a high-quality optical characteristic in which deterioration of the optical characteristic due to the excess joining material at the time of assembly is prevented may be realized.

Also, it becomes possible to make the width (X-direction) of the sub mount B9 the same as the width (X-direction) of the solid laser 3 without limit. According to this, the heat generated by the solid laser 3 may be efficiently transferred to the heat sink B4 to be diffused. Also, by controlling the direction in which the joining material 12 flows, a small optical module may be obtained.

Second Embodiment

Although the case in which the slit-like concave portion 11 is provided on the rear surface of the sub mount B (the joining surface of the sub mount B9 with the heat sink B4) as the groove portion is described in the above-described first embodiment, when there is no problem in optical performance, it is also possible to provide the groove portion on the rear surface of the optical element itself as described above and directly join the optical element onto the heat sink without the sub mount. According to this configuration, the number of components of the optical module may be reduced, an assembly work may be simplified and a cost may be reduced.

Third Embodiment

Although the case in which the slit-like concave portion 11 is provided on the rear surface of the sub mount B (the joining surface of the sub mount B9 with the heat sink B4) as the groove portion is described in the above-described first embodiment, the shape of the groove portion may be any shape as long as this may control the flow direction of the excess joining material 12 generated when joining the sub mount B9 to the heat sink B4 to allow to flow in the direction substantially orthogonal to the optical axis L, and the groove portion such as a triangle groove may be provided, for example. A method of forming the groove portion such as the triangle groove on the sub mount B9 includes the mechanical fabrication and the method of forming the wall portion of the groove portion by means of plating and etching.

Fourth Embodiment

Although the case in which the slit-like concave portion 11 is provided on the rear surface of the sub mount B (the joining surface of the sub mount B9 with the heat sink B4) is described in the above-described first embodiment, the slit-like concave portion may be formed in the direction substantially orthogonal to the optical axis L as the groove portion on the joining surface of the heat sink B4 with the sub mount B9. In this case also, the same effect as in the case in which the slit-like concave portion 11 is provided on the rear surface of the sub mount B (the joining surface of the sub mount B9 with the heat sink B4) as the groove portion may be obtained.

In this case also, the shape of the groove portion may be any shape as long as this may control the flow direction of the excess joining material 12 generated when joining the sub mount B9 to the heat sink B4 to allow to flow in the direction substantially orthogonal to the optical axis L, and the groove portion such as the triangle groove may be provided, for example.

The method of forming the groove portion such as the triangle groove on the sub mount B9 and the heat sink B4 includes the mechanical fabrication and the method of forming the wall portion of the groove portion by means of plating and etching.

INDUSTRIAL APPLICABILITY

As described above, the laser light source device according to the present invention is useful as the laser light source device in which a plurality of optical elements are optically directly coupled with each other by means of the butt joint.

The invention claimed is:

1. A laser light source device, comprising:
   at least one optical element;
   at least one heat sink on which the at least one optical element is joined via contact surfaces of a first joining surface formed on the at least one optical element;
   a groove portion extending in a direction substantially orthogonal to an optical axis of light in the laser light source device formed on the first joining surface of the at least one optical element for joining with a second joining surface of the at least one heat sink wherein a width of the groove in a direction substantially parallel to the optical axis of light in the laser light source device is greater than a width of a sum of the contact surfaces in the direction substantially parallel to the optical axis of light in the laser light source device, the contact surfaces of the first joining surface directly contacting the second joining surface; and
   a joining material for bonding the at least one optical element to the heat sink, the joining material provided in the groove portion.

2. The laser light source device according to claim 1, wherein
   the groove portion is provided on a plurality of optical elements arranged to be adjacent.

3. The laser light source device according to claim 1, comprising:

a plurality of heat sinks, the laser light source device formed by joining the plurality of heat sinks to each other by the joining material such that a plurality of optical elements are optically joined to each other.

4. The laser light source device according to claim 1, wherein
the optical element includes an upper surface and a lower surface, the groove being formed in the lower surface.

5. A laser light source device, comprising:
at least one optical element;
at least one sub mount, the optical element being joined to the sub mount;
at least one heat sink on which the at least one optical element is joined through the at least one sub mount, the at least one heat sink having a substantially flat first joining surface; and
a groove portion extending in a direction substantially orthogonal to an optical axis of light in the laser light source device formed on a second joining surface of the at least one sub mount for joining with the first joining surface of the at least one heat sink via contact surfaces formed on the second joining surface that directly contact the first joining surface, wherein a width of the groove in a direction substantially parallel to the optical axis of light in the laser light source device is greater than a width of a sum of the contact surfaces in the direction substantially parallel to the optical axis of light in the laser light source device; and
a joining material for bonding the at least one optical element to the at least one sub mount, the joining material provided in the groove portion wherein a width of the joining surface is less than a width of the heat sink.

6. The laser light source device according to claim 5, wherein
the groove portion is provided on each of a plurality of sub mounts arranged to be adjacent.

7. The laser light source device according to claim 5, comprising:
a plurality of heat sinks, the laser light source device formed by joining the plurality of heat sinks to each other by the joining material such that a plurality of optical elements are optically joined to each other.

8. The laser light source device according to claim 5, wherein
the sub mount includes an upper surface and a lower surface, the groove being formed in the lower surface.

* * * * *